(12) United States Patent
Hsu

(10) Patent No.: US 9,431,640 B2
(45) Date of Patent: Aug. 30, 2016

(54) MOBILE POWER SUPPLY

(71) Applicant: Powergene Technology Co., Ltd., Taiwan Branch, New Taipei (TW)

(72) Inventor: Hui-Te Hsu, New Taipei (TW)

(73) Assignee: POWERGENE TECHNOLOGY CO., LTD. TAIWAN BRANCH, New Taipei (TW)

( * ) Notice: Subject to any disclaimer, the term of this patent is extended or adjusted under 35 U.S.C. 154(b) by 158 days.

(21) Appl. No.: 14/552,488

(22) Filed: Nov. 25, 2014

(65) Prior Publication Data
US 2016/0149176 A1 May 26, 2016

(51) Int. Cl.
| | |
|---|---|
| *H01M 2/10* | (2006.01) |
| *H02J 7/00* | (2006.01) |
| *H01M 10/42* | (2006.01) |
| *H01M 10/6554* | (2014.01) |
| *H01M 10/615* | (2014.01) |
| *H01M 2/22* | (2006.01) |
| *H01M 10/48* | (2006.01) |
| *H01M 10/623* | (2014.01) |
| *H05K 5/00* | (2006.01) |

(52) U.S. Cl.
CPC ............ *H01M 2/1022* (2013.01); *H01M 2/22* (2013.01); *H01M 10/4257* (2013.01); *H01M 10/482* (2013.01); *H01M 10/615* (2015.04); *H01M 10/623* (2015.04); *H01M 10/6554* (2015.04); *H02J 7/0042* (2013.01); *H02J 7/0054* (2013.01); *H05K 5/0086* (2013.01); *H01M 2220/30* (2013.01)

(58) Field of Classification Search
None
See application file for complete search history.

(56) References Cited

U.S. PATENT DOCUMENTS

| | | | | |
|---|---|---|---|---|
| 2014/0335462 A1* | 11/2014 | Cebulski | ................ | F23Q 13/00 431/135 |
| 2015/0189053 A1* | 7/2015 | LaHam | .................... | H04M 1/11 455/575.1 |

* cited by examiner

*Primary Examiner* — Scott J Chmielecki
(74) *Attorney, Agent, or Firm* — Chun-Ming Shih; HDLS IPR Services

(57) ABSTRACT

A mobile power supply includes a case, a control circuit board, a power storage module, a heating element and a thermal sheet. The case is with a hole formed thereon. The control circuit board is disposed in the case. A plurality of electrical connectors is welded on the control circuit board and is exposed by the case. The power storage module is disposed in the case and electrically connected to the control circuit board. The heating element is disposed on the case and exposed at the hole. The heating element is electrically connected to the control circuit board. The thermal sheet is attached to the case and in contact with the heating element. Thereby, the mobile power supply may provide heat and be used for heat preservation or for keeping warm.

9 Claims, 5 Drawing Sheets

MOBILE POWER SUPPLY

TECHNICAL FIELD

The disclosure relates to a mobile power supply, more particularly to a mobile power supply capable of providing heat.

BACKGROUND

Nowadays wireless communication and wireless internet are popular so mobile devices are utilizing these technology more often, which leads to great power consumption. Hence, more people carry a mobile power pack for charging their mobile devices. The mobile power pack is a portable charger which is rechargeable and can supply power. Generally speaking, the mobile power pack uses lithium batteries and is safe and reliable. Besides, it can provide a large amount of power.

However, the current mobile power pack is merely designed for charging and it is without other meaningful functions. Furthermore, the current mobile power pack is, to some extent, big and heavy. In other words, it has only one function and is not well designed.

Thus, the goal of the disclosure is to improve the current mobile power pack and to address the issues mentioned above.

SUMMARY

The purpose of the disclosure is to introduce a mobile power supply capable of providing heat.

For reaching this goal, the disclosure provides a mobile power supply comprising a case, a control circuit board, a power storage module, a heating element and a thermal sheet. The case is with a hole formed thereon. The control circuit board is disposed in the case, wherein a plurality of electrical connectors is welded on the control circuit board and is exposed by the case. The power storage module is disposed in the case and electrically connected to the control circuit board. The heating element is disposed on the case and exposed at the hole, wherein the heating element is electrically connected to the control circuit board. The thermal sheet is attached to the case and in contact with the heating element.

The thermal sheet extends and forms a tray separated from the case while the tray recesses and thus forms an accommodating chamber. A magnetic element is mounted on the thermal sheet for being attached to the heating element or another magnetic element corresponding to the magnetic element and is disposed on the case. A reed switch is disposed on a place on the control circuit board corresponding to the magnetic element.

A switch assembly may be disposed on the control circuit board. The switch assembly comprises a switch element welded on the control circuit board and a button connected to the switch element. The button protrudes from the case. A plurality of indicating lights may be disposed on the control circuit board. Each of the indicating lights comprises a lighting element welded on the control circuit board and a light guide element corresponding to the arrangement of the lighting element. The light guide element is exposed by the case.

The mobile power supply of the disclosure can not only charge the mobile electronic device but also be used for heat preservation and for keeping warm, because of its heating element and thermal sheet.

BRIEF DESCRIPTION OF THE DRAWINGS

The disclosure will become more fully understood from the detailed description and the drawings given herein below for illustration only, and thus does not limit the disclosure, wherein.

DETAILED DESCRIPTION

Figure 1:
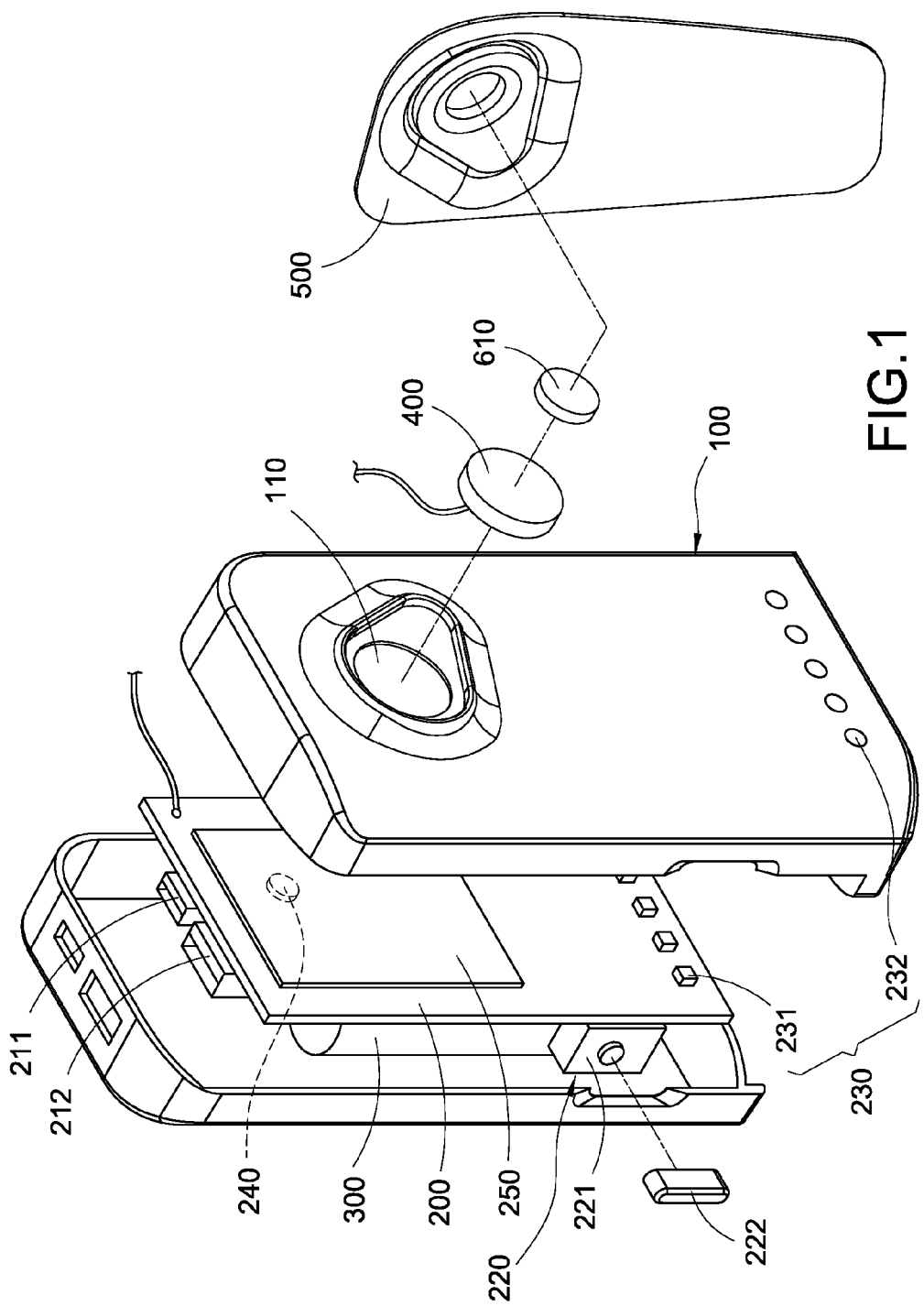
FIG. 1 is an exploded view of a mobile power supply according to the first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
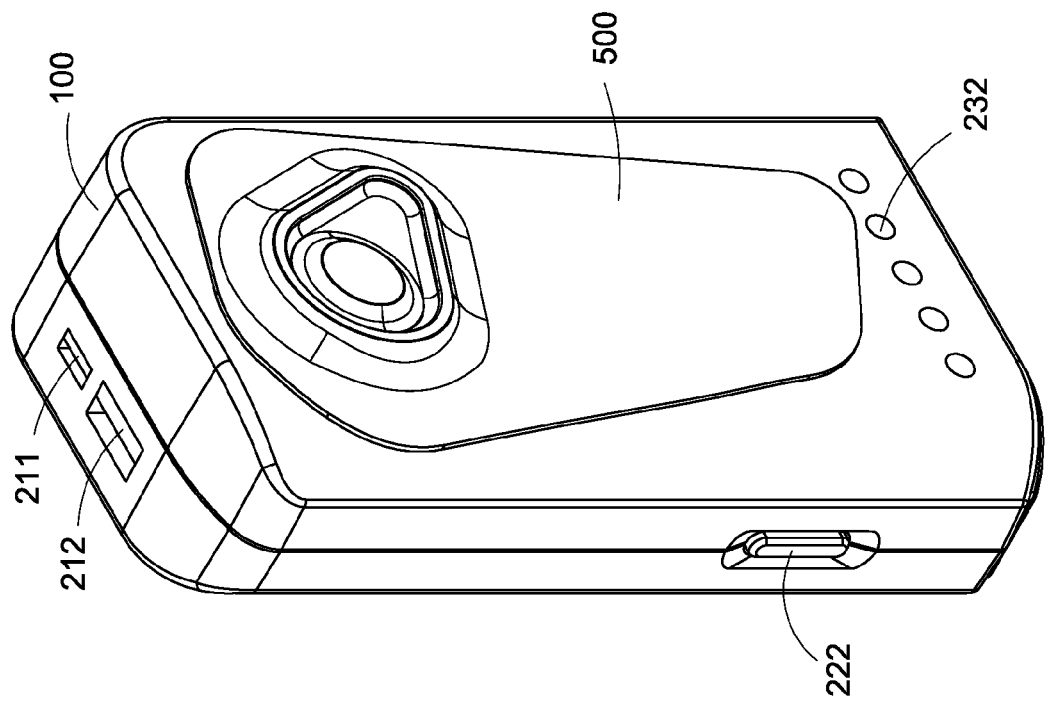
FIG. 2 is a perspective view of the mobile power supply according to the first embodiment of the disclosure.
Figure 3:
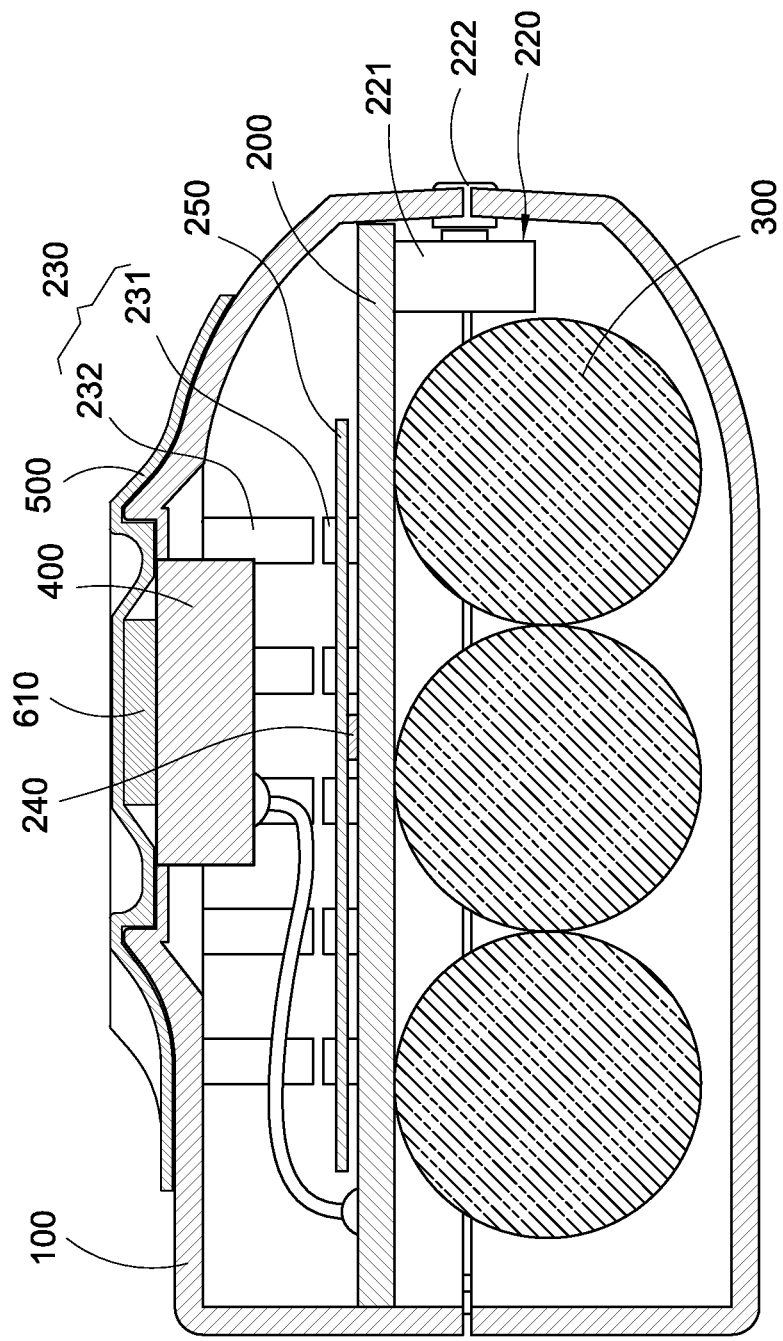
FIG. 3 is a sectional view of the mobile power supply according to the first embodiment of the disclosure.

Referring to FIG. 1 to FIG. 3, a mobile power supply according to the first embodiment of the disclosure comprises a case 100, a control circuit board 200, a power storage module 300, a heating element 400 and a thermal sheet 500.

In this embodiment, the case 100 is a hollow housing made of plastic. A hole 110 is formed on the case 100.

The control circuit board 200 is disposed in the case 100. A plurality of electrical connectors 211/212, a switch assembly 220, a plurality of indicating lights 230 and a reed switch 240 are disposed on the control circuit board 200. In this embodiment, two different types of electrical connectors 211/212 are welded on the control circuit board 200, but the number and the types of the electrical connectors 211/212 are not intended to limit the disclosure. The electrical connectors 211/212 are electrically connected to the control circuit board 200 respectively and are exposed on the outer surface of the case 100 for plugging. In this embodiment, the switch assembly 220 comprises a switch element 221 welded on the control circuit board 200 and a button 222 connected to the switch element 221. The button 222 is movably disposed through the case 100 and protrudes from the outer surface of the case 100 in order to be pressed for operation. Each indicating light 230 comprises a lighting element 231 welded on the control circuit board 200 and a light guide element 232 corresponding to the arrangement of the lighting element 231. The light guide element 232 goes through the case and is exposed on the outer surface of the case 100. In this embodiment, the light element 231 is preferably to be a light-emitting diode (LED) while the light guide element 232 is a transparent cylinder. One end of the light guide element 232 corresponds to the LED while the other end is exposed on the outer surface of the case 100.

In this embodiment, the power storage module 300 is multiple lithium batteries electrically connected together, but the type of power storage module 300 is not limited to the lithium battery. The power storage module 300 is disposed in the case 100 and is electrically connected to the control circuit board 200. The power storage module 300 may be turned on or off via the switch assembly 220. One of the electrical connectors (211) may charge the power storage module 300 via the control circuit board 200 and is preferably to be connected to the mains electricity. The power storage module 300 may supply power to the other electrical connector 212 and this electrical connector 212 may be connected to a mobile electronic device such that the power storage module can charge the mobile electronic device. Moreover, the control circuit board 200 is able to read the remaining power of the power storage module 300 and light up different number of indicating lights accordingly, for indication.

In this embodiment, the heating element 400 is disposed in the hole 110 of the case 100 and is exposed by the case 100. The heating element 400 is electrically connected to the control circuit board 200. Via the control circuit board 200, the power storage module 300 may provide power to the heating element 400 for generating heat. Preferably, an insulation pad 250 can be disposed between the control circuit board 200 and the heating element 400 to prevent heat generated by the heating element 400 from transferring to the control circuit board 200, which causes it to be burned.

In this embodiment, the thermal sheet 500 is a sheet made of aluminum and the shape of it corresponds to the surface of the case 100 so it can be attached to the case 100. Additionally, the thermal sheet 500 in contact with the heating element 400 can evenly spread the heat generated by the heating element 400 on the thermal sheet 500. A magnetic element 610, which is preferably a magnet, is mounted on the thermal sheet such that the thermal sheet 500 can be attached to the case 100 by attaching the magnetic element 610 to the heating element 400. The reed switch 240 on the control circuit board 200 corresponds to the place of the magnetic element 610.

When the switch assembly 220 is set to be on which makes the power storage module 300 start providing power, the control circuit board 200 is preset not to supply power to the heating element 400. When the thermal sheet 500 is attached to the case 100, only the magnetic element 610/620 on the thermal sheet 500 is able to start the reed switch 240 and causes the control circuit board 200 to make the power storage module 300 to provide power to the heating element 400. As a result, this can avoid the heating element 400 burning users when the switch assembly 220 is on while the thermal sheet 500 is not installed, thereby improving the safety of the heating element 400.

Figure 4:
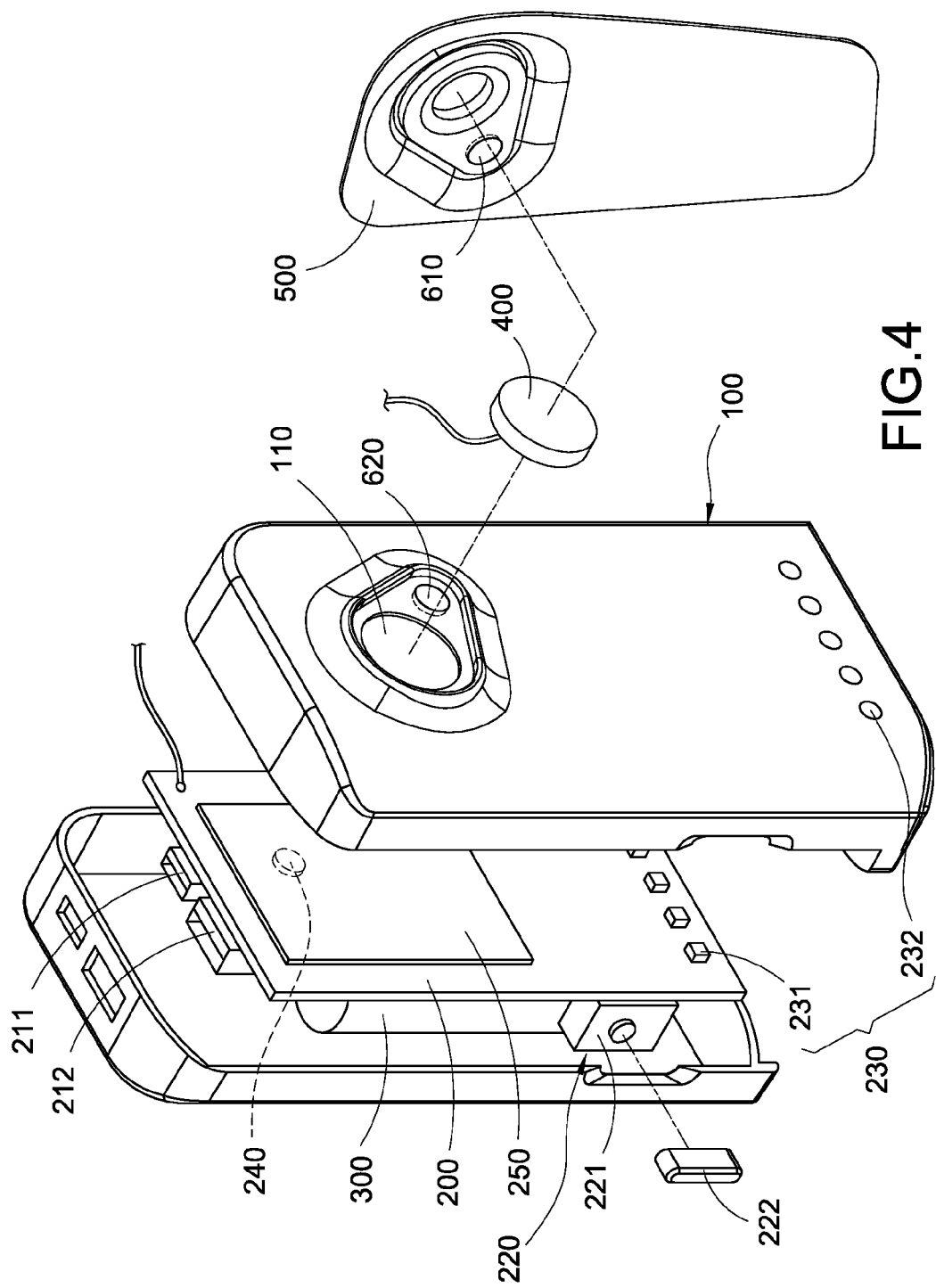
FIG. 4 is a perspective view of a mobile power supply according to the second embodiment of the disclosure.

As shown in FIG. 4, a mobile power supply according to the second embodiment of the disclosure comprises a case 100, a control circuit board 200, a power storage module 300, a heating element 400 and a thermal sheet 500. The structure of the mobile power supply of the second embodiment is similar to that of the first embodiment and only the differences between them will be illustrated.

In this embodiment, a magnetic element 610 is mounted on the thermal sheet 500 and is preferably to be a magnet. Another magnetic element 620 corresponding to the magnetic element 610 is disposed on the case 100 and the magnetic element 620 may be magnetic component or a non-magnetic iron component. The magnetic elements 620 may be attached to each other for attaching the thermal sheet 500 to the case 100.

When the magnetic element 620 on the case 100 is a non-magnetic iron component, a reed switch 240 corresponding to the magnetic element 610 on the thermal sheet 500 may be disposed on the control circuit board 200 for control the power supply of the heating element 400. This can assure the safety of the heating element 400.

Figure 5:
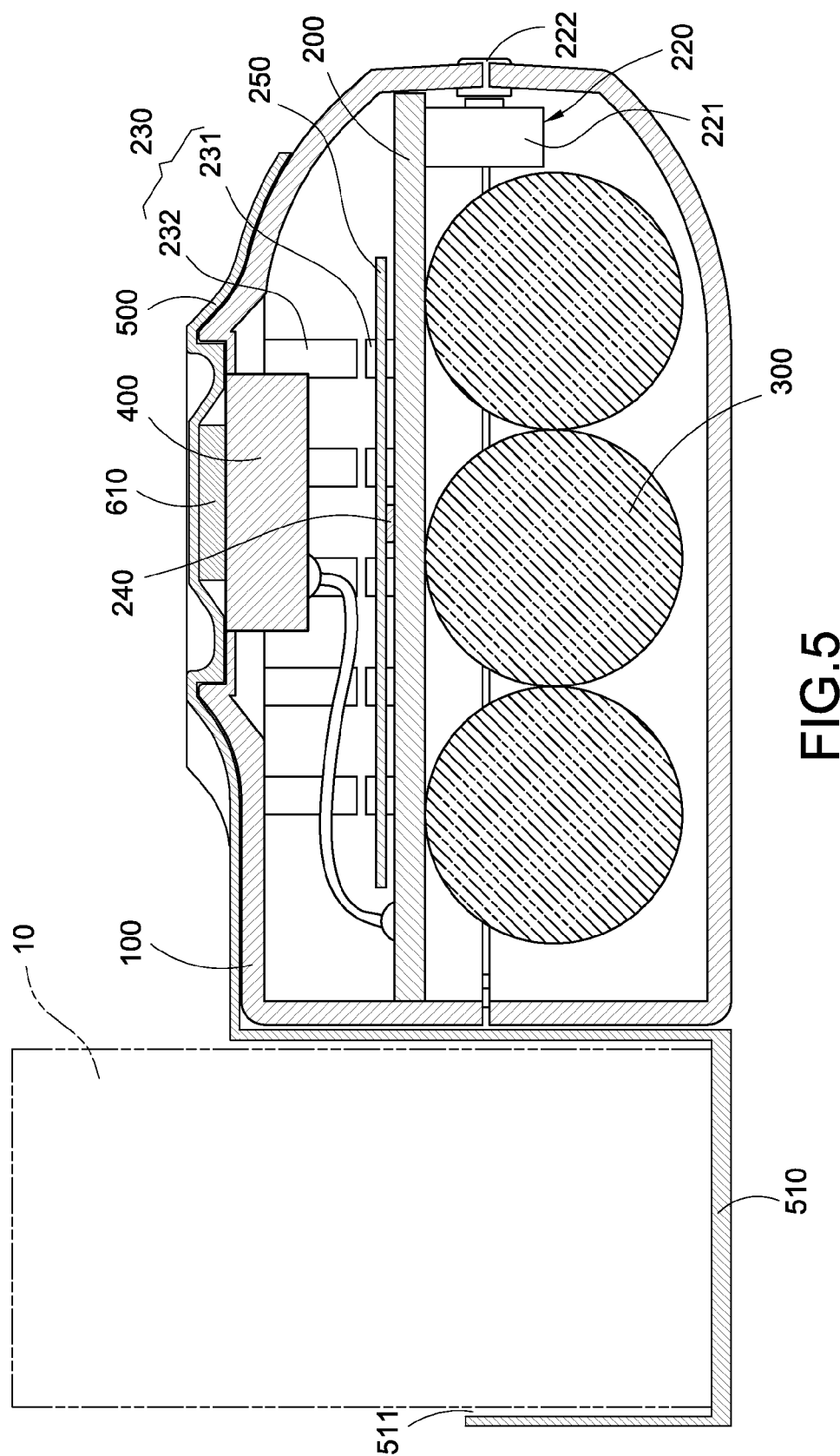
FIG. 5 is a schematic view of a mobile power supply according to the third embodiment of the disclosure.

As seen in FIG. 5, a mobile power supply according to the third embodiment of the disclosure comprises a case 100, a control circuit board 200, a power storage module 300, a heating element 400 and a thermal sheet 500. The structure of the mobile power supply of the second embodiment is similar to that of the first embodiment and only the differences between them will be illustrated.

In this embodiment, the thermal sheet 500 extends and forms a tray 510 separated from the case 100. The tray 510 recessed and therefore forms an accommodating chamber 511 for a beverage can 10 to be placed on. Thereby, the beverage can 10 may be heated by the thermal sheet 500 in order for heat preservation.

The mobile power supply of the disclosure can not only charge the mobile electronic device but also provide power to the heating element for generating heat, via the power storage module 300. In addition, the thermal sheet 500 can evenly spread the heat for keeping the users warm. A certain type of the thermal sheet 500 may further be used for heat preservation of a beverage can.

What is claimed is:

1. A mobile power supply comprising:
  a case with a hole formed thereon;
  a control circuit board disposed in the case, wherein a plurality of electrical connectors is welded on the control circuit board and is exposed by the case;
  a power storage module disposed in the case and electrically connected to the control circuit board;
  a heating element disposed on the case and exposed at the hole, wherein the heating element is electrically connected to the control circuit board; and
  a thermal sheet attached to the case and in contact with the heating element.

2. The mobile power supply according to claim 1, wherein a magnetic element is mounted on the thermal sheet while another magnetic element corresponding to and for attracting the magnetic element is disposed on the case.

3. The mobile power supply according to claim 1, wherein a magnetic element is mounted on the thermal sheet and is attached to the heating element.

4. The mobile power supply according to claim 1, wherein a reed switch is disposed on a place on the control circuit board corresponding to the magnetic element.

5. The mobile power supply according to claim 1, wherein a switch assembly is disposed on the control circuit board and is exposed by the case.

6. The mobile power supply according to claim 5, wherein the switch assembly comprises a switch element welded on the control circuit board and a button connected to the switch element, and the button protrudes from the case.

7. The mobile power supply according to claim 1, wherein a plurality of indicating lights is disposed on the control circuit board and is exposed by the case.

8. The mobile power supply according to claim 7, wherein each of the indicating lights comprises a lighting element welded on the control circuit board and a light guide element corresponding to the arrangement of the lighting element, and the light guide element is exposed by the case.

9. The mobile power supply according to claim 1, wherein the thermal sheet extends and forms a tray separated from the case while the tray recesses and thus forms an accommodating chamber.

* * * * *